United States Patent [19]

Spohnheimer

[11] 4,358,659
[45] Nov. 9, 1982

[54] METHOD AND APPARATUS FOR FOCUSING A LASER BEAM ON AN INTEGRATED CIRCUIT

[75] Inventor: John V. Spohnheimer, The Colony, Tex.

[73] Assignee: Mostek Corporation, Carrollton, Tex.

[21] Appl. No.: 282,865

[22] Filed: Jul. 13, 1981

[51] Int. Cl.³ .............................................. B23K 27/00
[52] U.S. Cl. ...................... 219/121 LB; 219/121 LG; 219/121 LH; 219/121 LJ; 219/121 LN; 219/121 LR; 219/121 LX
[58] Field of Search .................. 219/121 LX, 121 LA, 219/121 LB, 121 LN, 121 LP, 121 LR, 121 LG, 121 LH, 121 LJ, 121 L, 121 LV, 121 LM; 324/158 F, 158 R; 29/825, 620

[56] References Cited

U.S. PATENT DOCUMENTS

| | | | |
|---|---|---|---|
| 3,569,660 | 3/1971 | Houldcroft | 219/121 LR X |
| 3,583,561 | 6/1971 | Wiesler | 219/121 LH X |
| 3,893,129 | 7/1975 | Emlo et al. | 219/121 LH X |
| 4,172,741 | 10/1979 | Johnson | 219/121 LH X |
| 4,272,775 | 6/1981 | Compton et al. | 219/121 LH X |

Primary Examiner—C. L. Albritton

[57] ABSTRACT

A laser beam (38) is focused on the surface of a semiconductor substrate (10) by translating an objective lens (70) along the path of the laser beam (38). The substrate (10) is fabricated to have a region (12) of an opposite conductivity type and to have a barrier layer (18) to the laser beam (38). An opening (16) is provided in the barrier layer (18) to permit the laser beam (38) to strike the substrate (10). A voltage source (24) and resistance (26) are connected in series between the substrate (10) and the region (12) to form a reverse biased diode junction. When the laser beam (38) strikes the substrate (10) charge carriers (42) are generated to produce a current through the resistor (26). The current flow through the circuit is measured by a control circuit (84) which drives a mechanism (72, 74, 76, 78, 80) to position the objective lens (70) such that the focus point of the laser beam (38) is positioned at the surface of the substrate (10). The maximum current flow through the PN junction is produced when the maximum intensity of laser energy is directed to the substrate (10). The primary application of the focusing apparatus disclosed herein is for burning out links to substitute redundant circuit elements for defective elements in an integrated circuit.

9 Claims, 5 Drawing Figures 4,358,659

METHOD AND APPARATUS FOR FOCUSING A LASER BEAM ON AN INTEGRATED CIRCUIT

TECHNICAL FIELD

The present invention pertains to the manufacture of integrated circuits and more particularly to the focusing of a laser beam on an integrated circuit to cut a connecting link.

BACKGROUND OF THE INVENTION

Integrated circuits are typically manufactured by using a plurality of similar dies on a single large wafer which may be four to five inches in diameter. As many as several hundred dies may be fabricated on each wafer but due to imperfections in processing many of the dies produced on a wafer will be defective. A single die may have thousands of transistors and conducting lines and the failure of any one of these elements can cause the die to be defective. The percentage of good dies for a wafer is referred to as the yield. The cost per die is naturally lower when the yield is made higher.

Certain types of integrated circuits, such as semiconductor memories, have a plurality of similar circuits. It is possible to test a device of this type and determine exactly which one of the plurality of circuits is defective. The device can be manufactured to have a number of extra circuits without substantially increasing the size of the die. It is then possible to take a normally defective die and test the die to find the specific defective circuit. By performing operations upon the die the defective circuit can be disconnected and one of the extra circuits interconnected to operate in place of the defective circuit. This procedure makes it possible to "repair" many of the dies which would normally be discarded. If a significant number of the dies can thus be repaired the yield can be increased thereby decreasing the unit cost.

One procedure for removing a defective circuit and replacing it with an extra operable circuit is to burn-out circuit links of the die with the use of a laser beam. However, the laser beam must be precisely aigned and precisely focused in order to blow the desired link without harming nearby conductor lines and circuit elements. As the line dimensions for integrated circuits become smaller it becomes more difficult to properly focus the laser beam to blow the desired links. The procedure for focusing the laser beam must also be extremely fast in order to economically operate on the dies at a mass production rate.

Therefore, there exists a need for a method and apparatus for rapidly and accurately focusing a laser beam on the surface of an integrated circuit.

SUMMARY OF THE INVENTION

A method and apparatus is disclosed for focusing a laser beam onto the surface of an integrated circuit. The integrated circit has a substrate having a first conductivity type which includes a region of a second conductivity type. A layer of material opaque to a laser beam, such as metal, is fabricated on the surface of the substrate essentially over the region. The layer of material is fabricated to have an opening to expose a portion of the substrate over the region. The laser beam is directed toward the opening which exposes the substrate. Charge carriers are generated when the laser beam strikes the substrate and the charge carriers tend to produce a current between the substrate and the region. A control signal is produced by circuitry connected between the region and the substrate. The control signal is proportional to the intensity of the laser beam which is impinging on the substrate through the opening. Apparatus is provided which functions in response to the control signal for focusing the laser beam to maximize the intensity of the beam at the plane of the contact of the laser beam with the substrate. When the limit of the control signal is reached the laser beam is properly focused thereby applying the maximum energy into the smallest possible area.

BRIEF DESCRIPTION OF THE DRAWING

For a more complete understanding of the present invention and the advantages thereof, reference is now made to the following description taken into conjunction with a accompanying drawings in which.

DETAILED DESCRIPTION

Figure 1:
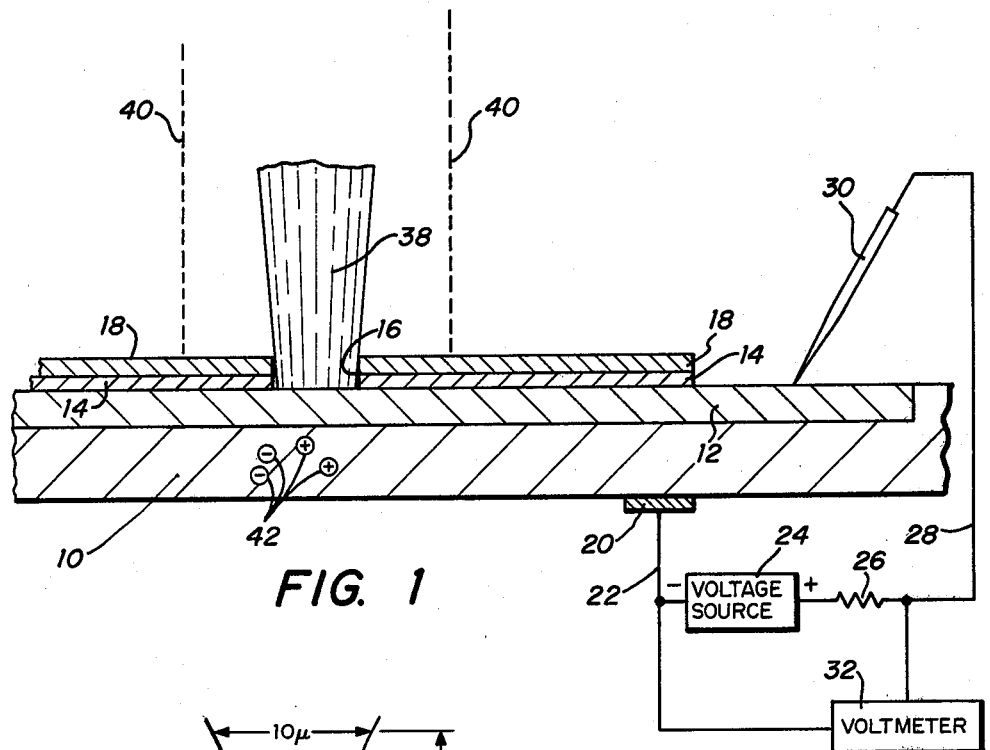
FIG. 1 is an elevation view of a semiconductor substrate in which an N+ region has been formed in the substrate and a laser beam is directed through an opening in a metal layer covering the substrate.

The alignment of a laser beam on the surface of an integrated circuit die is illustrated in FIG. 1. A semiconductor substrate 10, which is doped to be a P-type material, has a region 12 fabricated in the substrate and the region 12 is doped to have an N+ characteristic. The region 12 is formed in the substrate 10 by typical methods of diffusion or ion implantation. A layer 14 of insulating material, such as silicon dioxide, is formed on the surface of the substrate 10 and region 12. An opening 16 is formed in the layer 14 to leave a portion of the substrate 10 exposed.

A metallization layer 18, such as aluminum, is deposited over the insulating layer 14 while leaving the opening 16 clear over the substrate 10.

A contact 20 is made to the substrate 10 and a line 22 is connected between the contact 20 and a volage source 24. A resistor 26 is connected between the volage source 24 and a line 28 which extends to a probe 30. The probe 20 is positioned such that it is in contact with the region 12. A voltmeter 32 is connected to the line 28 and the line 22 to measure the volage at the region 12.

A semiconductor wafer which includes the substrate 10 is placed within a machine which produces a laser beam that can be directed to any portion of the wafer. Such a machine is a Model 80 MicroLase Wafer Processor which is manufactured by Electro Scientific Industries, Inc. The laser beam produced by the machine is directed generally toward the substrate 10 in the region of the opening 16. As described below the focus point of the laser beam can be adjusted upward or downward relative to the surface of the substrate 10. A laser beam 38 is shown in FIG. 1 where the beam is focused to transmit the maximum energy through the opening 16 to the substrate 10. The lines 40 illustrate the outer edges of laser beam 33 when the focus point of the beam is substantially offset from the surface of substrate 10. Although the laser beam illustrated by lines 40 does strike the substrate 10 through the opening 16, the energy impinging on the substrate is much less. Metallization layer 18 acts as a barrier and effectively blocks the laser energy which strikes it and prevents a portion of the laser beam from impinging upon the substrate 10.

The P-type substrate 10 and the N-type region 12 form a diode junction which is reversed biased by the volage source 24. In the absence of the laser beam 38 there will be essentially no current flow across the junction and through the circuit which includes the voltage source 24 and resistor 26. Therefore the reading of the voltmeter 32 will be essentially the voltage of the source 24. But, when the laser beam 38 strikes the substrate 10 charge carriers such as 42 will be generated and will cause a flow of current between the substrate 10 and region 12. This current flow will pass through resistor 26, which has a preferred impedance in the range of one kilohm. The reading of the voltmeter 32 will thus drop as a current flow is established through the circuit connecting region 12 and substrate 10.

Figure 2:
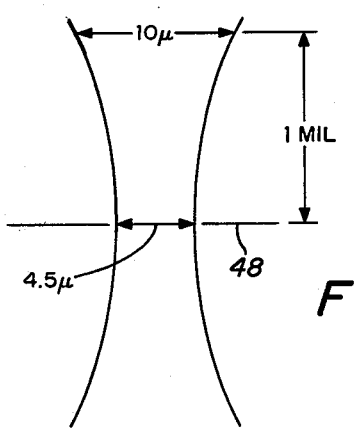
FIG. 2 is an illustration of the diameter of the focus point of the laser beam as a function of the elevation above the surface of the substrate.

The width of the focus point of the laser beam 38 is illustrated in FIG. 2. The minimum diameter of the focus point of the beam is shown at plane 48. At plane 48 the beam has a diameter of approximately 4.5 microns. At a distance of one mil above or below the plane 48 the beam has a width of approximately 10 microns. In reference to FIGS. 1 and 2 it can be seen that if the opening 16 is approximately 4.5 microns in diameter the beam 38 will transmit essentially all of its energy to the substrate 10 only when the focus point of the beam is at the surface of the substrate. When the focus point of the beam is moved approximately one mil above or below the surface of the substrate the beam will have a width as shown essentially by the lines 40. At the focus condition shown by lines 40 the intensity of the laser energy striking the substrate 10 is much less and therefore fewer change carriers are generated.

Figure 3:
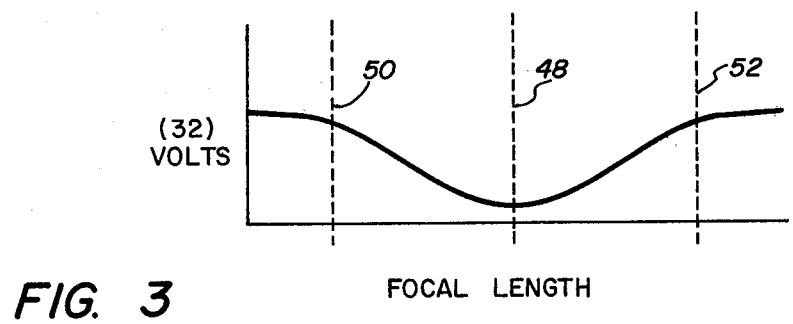
FIG. 3 is a plot of the signal amplitude measured at the N+ region in the semiconductor substrate as a function of laser beam focal length.

The voltage reading of the voltmeter 32 as a function of focal length of the laser beam is illustrated in FIG. 3. When the laser beam 38 is focused such that the maximum energy intensity is directed to the substrate 10 the voltage reading of the voltmeter 32 will be a minimum as shown at line 48. When the focus point of the laser beam is offset from the surface of substrate 10 the voltage reading goes up substantially and approaches that of the voltage souce 24. This condition is illustrated by lines 50 and 52. Thus, it can be seen from FIGS. 1-3 that the laser beam is properly focused to have the maximum energy intensity on the substrate 10 when the reading of the voltmeter 32 is at a minimum.

Figure 4:
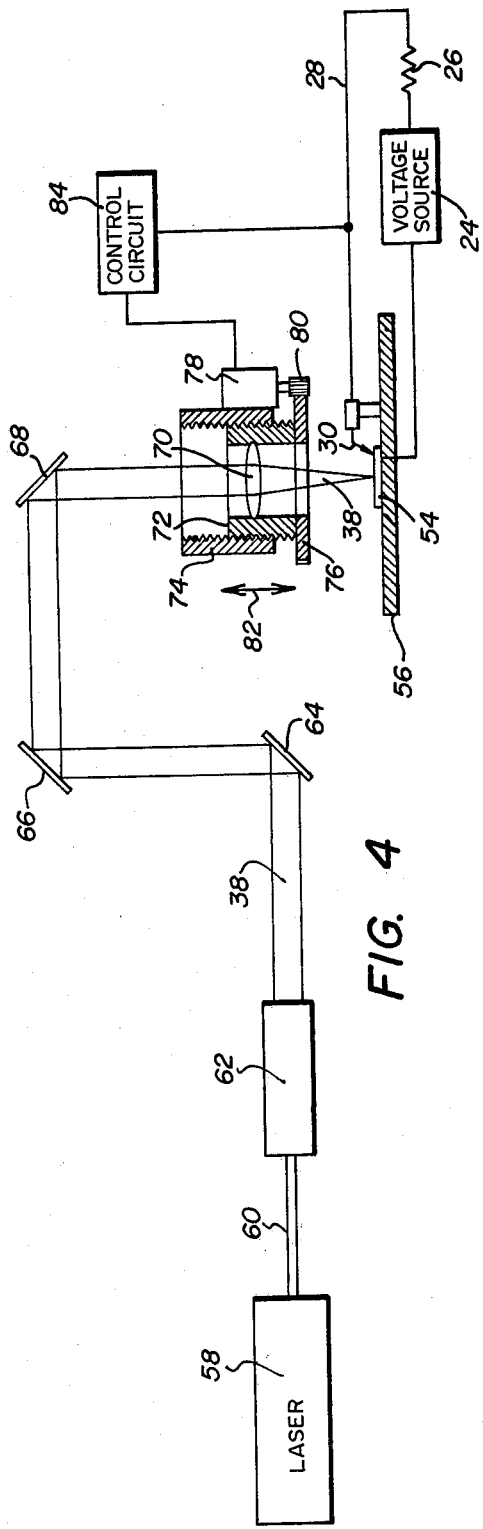
FIG. 4 is an illustration of apparatus which varies the position of the focus point of the laser beam as a function of the control signal produced by the laser beam impinging upon the substrate.
Figure 5:
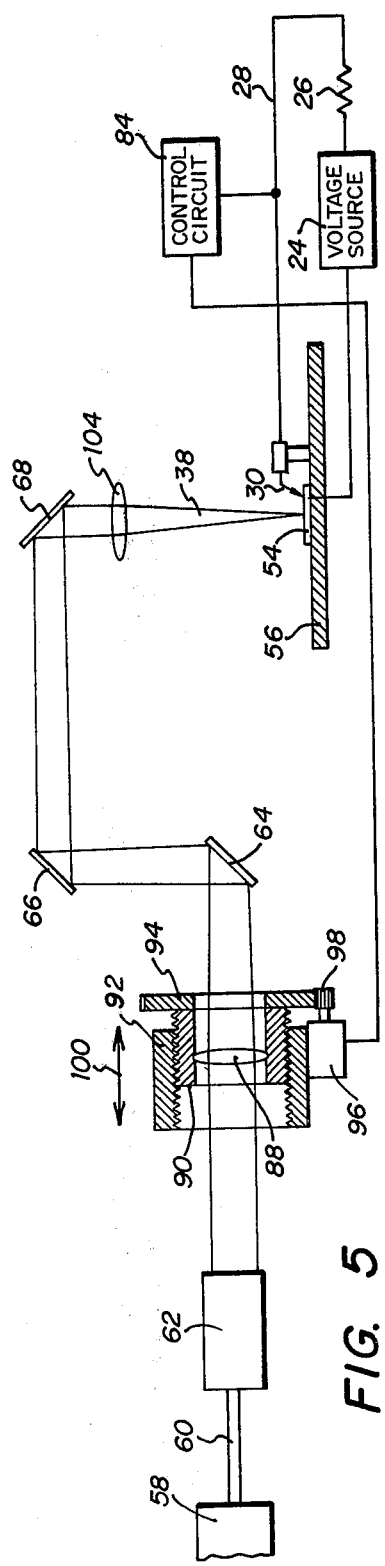
FIG. 5 is an illustration of further apparatus for adjusting the focus point of the laser beam such that it impinges upon the semiconductor substrate with a minimum area.

Apparatus for automatically focusing the laser beam on the surface of silicon substrate is illustrated in FIGS. 4 and 5. Referring to FIG. 4, a wafer 54 includes the semiconductor structure as illustrated in FIG. 1. The wafer 54 is securely mounted on a fixed table 56.

A laser 58 produces a narrow beam 60 which is transmitted to a collimator 62 which expands the width of the beam 60 to produce the beam 38. From the collimator 62 the beam 38 is directed through a series of 45° mirrors 64, 66 and 68.

The laser beam 38 is directed from mirror 68 through an objective lens 70 having a relatively short focal length. The lens 70 is mounted in an externally threaded cylinder 72 which engages the interior threads of a cylinder 74. The lower end of cylinder 72 has a ring gear 76 mounted thereon. An electric motor 78 has a gear 80 mounted on the shaft thereof for engagement with the ring gear 76. By driving the electric motor 78 the ring gear 76 is caused to rotate thereby causing the lens 70 to be translated in either of the directions indicated by arrow 82. As the lens 70 is moved up or down the focus point of the beam 38 is likewise moved up and down such that the beam 38 can be focused on the substrate 10.

A control circuit 84 monitors the voltage on the region 12 through the probe 30. The control circuit 84 drives the motor 78 such that the focus point of the beam 38 is aligned with the surface of the wafer 54. The control circuit 84 operates to find the minimum point of the voltage plot illustrated in FIG. 3.

A further embodiment of the present invention is illustrated in FIG. 5. The structure illustrated in FIG. 5 is substantially similar to that illustrated in FIG. 4 but with the exception that the focusing mechanism is placed between the output of the collimator 62 and the first mirror 64 rather than immediately above the wafer 54. In the embodiment illustrated in FIG. 5 an objective lens 88 is mounted to receive the beam 38 directly from the collimator 62. The lens 88 has a relatively long focal length. Lens 88 is mouned within an externally threaded cylinder 90 which engages an internally threaded cylinder 92. A ring gear 94 is connected to the cylinder 90.

An electric motor 96 is connected to the control circuit 84 to drive a gear 98 which engages the ring gear 94. The drive of motor 96 causes the lens 88 to be translated in either of the directions indicated by arrow 100. The control circuit 84 drives the motor 96 in order to focus the beam 38 and produce the minimum voltage at the region 12.

A fixed lens 104 is mounted beween mirror 68 and the wafer 54. Lens 104 has a relatively short focal length.

The lens 88 must necessarily have a long focal length in order to have the focal point at the surface of the wafer 54. Th focal length of lens 70 and lens 104 is substantially shorter since the lenses 70 and 104 are much closer to the wafer 54. Therefore, the embodiment illustrated in FIG. 4 is preferred over that shown in FIG. 5; however, the embodiment in FIG. 5 has the advantage that the lens assembly need not be mounted within the light weight arm structure which extends over the wafer 54.

The optimum focusing of the laser beam 38 is especially important in applications where links are to be opened in an integrated circuit. Such links are commonly provided to substitute redundant portions of a circuit for the parts of the circuit which are defective. This process serves to substatially increase yields in manufacturing. It is particularly useful in the manufacture of semiconductor memories where redundant column lines and sense amplifiers can be substituted in the place of corresponding defective elements in the basic circuit. As feature dimensions of integrated circuits become smaller it becomes more important that the laser beam be carefully focused to the desired link which will be opened. An incorrect focusing of the laser beam can easily burn out adjoining elements and destroy the entire circuit.

In summary, the present invention provides a method and apparatus for focusing a laser beam on the surface of an integrated circuit such that the focus point has a minimum diameter and the maximum energy intensity is applied to the substrate.

Although several embodiments of the invention have been illustrated in the accompanying drawings and described in the foregoing Detailed Description, it will be understood that the invention is not limited to the embodiments disclosed, but is capable of numerous rearrangements, modifications and substitutions without departing from the scope of the invention as defined by the following claims.

I claim:

1. Apparatus for focusing a laser beam, comprising:
   a semiconductor substrate having a first conductivity type;
   a region of a second conductivity type formed in said substrate;
   a layer of material which blocks said laser beam, said layer fabricated on said substrate above said region and having an opening therein to expose a portion of said substrate;
   means for directing said laser beam toward said substrate;
   means for detecting the generation of carriers in said substrate due to the impingement of said laser beam upon said region through said opening, and for producing a control signal proportional to the generation of said carriers; and
   means for focusing said laser beam in response to said control signal to minimize the diameter of said laser beam at the plane of contact of said laser beam with said substrate.

2. The apparatus recited in clam 1 wherein said layer comprises a metal which has been deposited on said substrate and etched to form said opening.

3. The apparatus recited in claim 1 wherein said means for detecting comprises:
   a DC voltage source having a first terminal thereof connected to said substate; and
   a resistor connected between a second terminal of said voltage source and said region, said control signal generated at the junction of said resistor and said region.

4. The apparatus recited in claim 1 wherein said means for focusing comprises:
   an objective lens in the path of said laser beam; and
   means responsive to said control signal for longitudinally translating said lens along the path of said laser beam to adjust the focal point of said laser beam to be at the surface of said substrate.

5. The apparatus recited in claim 4 wherein said lens is postioned immediately above but offset from said substrate such that the axis of said lens is essentially perpendicular to the surface of said substrate.

6. The apparatus recited in claim 4 wherein said lens is positioned horizontally offset from said substrate and oriented such that the axis of said lens is parallel to the surface of said substrate.

7. A method for focusing a laser beam on a semiconductor substrate, comprising the steps of:
   directing said laser beam toward a portion of said substrate adjacent a region of said substrate having an opposite conductivity type from that of said substrate, said substrate covered by a layer of material which blocks said laser beam, said layer having an opening therein to expose a portion of said substrate;
   detecting the production of charge carriers generated by said laser beam striking said substrate and generating a control signal related to the energy of said laser beam striking the exposed portion of said substrate; and
   adjusting the focus point of said laser beam in response to said control signal to produce the maximum intensity of said laser beam at the surface of said substrate.

8. The method recited in claim 7 wherein the step of detecting the production of charge carriers comprises connecting a voltage source and resistor in series between said substrate and said region and detecting the voltage at said region which voltage is said control signal.

9. The method recited in claim 7 wherein the step of adjusting the focus point of said laser beam comprises changing the longitudinal position of an objective lens which is in the path of said laser beam, said lens controlling the location of the focus point of said laser beam.

* * * * *